United States Patent
Jak et al.

(10) Patent No.: US 11,385,552 B2
(45) Date of Patent: Jul. 12, 2022

(54) METHOD OF MEASURING A STRUCTURE, INSPECTION APPARATUS, LITHOGRAPHIC SYSTEM AND DEVICE MANUFACTURING METHOD

(71) Applicant: ASML Netherlands B.V., Veldhoven (NL)

(72) Inventors: Martin Jacobus Johan Jak, 's-Hertogenbosch (NL); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/039,308

(22) Filed: Sep. 30, 2020

(65) Prior Publication Data
US 2021/0026256 A1 Jan. 28, 2021

Related U.S. Application Data

(62) Division of application No. 15/839,285, filed on Dec. 12, 2017, now Pat. No. 10,831,109.

(30) Foreign Application Priority Data

Dec. 15, 2016 (EP) .................................... 16204457

(51) Int. Cl.
*H01L 23/544* (2006.01)
*G03F 7/20* (2006.01)
(Continued)

(52) U.S. Cl.
CPC .......... *G03F 7/70633* (2013.01); *G03F 7/705* (2013.01); *G03F 7/70158* (2013.01);
(Continued)

(58) Field of Classification Search
CPC ............. G03F 7/70633; G03F 7/70158; G03F 7/70241; G03F 7/705; G03F 9/708;
(Continued)

(56) References Cited

U.S. PATENT DOCUMENTS 10,481,503 B2 * 11/2019 Van Der Schaar .......................... G03F 7/70683
10,831,109 B2 11/2020 Jak et al.
(Continued)

FOREIGN PATENT DOCUMENTS

| CN | 101114134 A | 1/2008 |
|---|---|---|
| TW | 201625935 A | 7/2016 |

(Continued)

OTHER PUBLICATIONS

International Search Report and Written Opinion of the International Searching Authority directed to related International Patent Application No. PCT/EP2017/080541, dated Feb. 2, 2018; 12 pages.
(Continued)

*Primary Examiner* — Bilkis Jahan
*Assistant Examiner* — Victor V Barzykin
(74) *Attorney, Agent, or Firm* — Sterne, Kessler, Goldstein & Fox P.L.L.C.

(57) ABSTRACT

An overlay metrology target (T) is formed by a lithographic process. A first image (740(0)) of the target structure is obtained using with illuminating radiation having a first angular distribution, the first image being formed using radiation diffracted in a first direction (X) and radiation diffracted in a second direction (Y). A second image (740 (R)) of the target structure using illuminating radiation having a second angular illumination distribution which the same as the first angular distribution, but rotated 90 degrees. The first image and the second image can be used together
(Continued)

(a)

(b)

so as to discriminate between radiation diffracted in the first direction and radiation diffracted in the second direction by the same part of the target structure. This discrimination allows overlay and other asymmetry-related properties to be measured independently in X and Y, even in the presence of two-dimensional structures within the same part of the target structure.

11 Claims, 8 Drawing Sheets

(51) Int. Cl.
*G03F 9/00* (2006.01)
*H01L 21/027* (2006.01)

(52) U.S. Cl.
CPC ...... *G03F 7/70241* (2013.01); *G03F 7/70683* (2013.01); *G03F 9/708* (2013.01); *H01L 21/0273* (2013.01); *H01L 23/544* (2013.01); *H01L 2223/54426* (2013.01)

(58) Field of Classification Search
CPC ............. G03F 7/70683; H01L 21/0273; H01L 23/544; H01L 2223/54426
See application file for complete search history.

(56) References Cited

U.S. PATENT DOCUMENTS

| | | |
|---|---|---|
| 2006/0033921 A1 | 2/2006 | Den Boef et al. |
| 2006/0066855 A1 | 3/2006 | Boef et al. |
| 2006/0197951 A1 | 9/2006 | Frommer et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0120396 A1* | 5/2012 | Kandel ................. G01B 11/14 356/399 |
| 2012/0123581 A1 | 5/2012 | Smilde et al. |
| 2012/0206703 A1* | 8/2012 | Bhattacharyya ........ G03F 7/705 355/67 |
| 2012/0242970 A1 | 9/2012 | Smilde et al. |
| 2013/0258310 A1* | 10/2013 | Smilde ................ G03F 7/70633 355/77 |
| 2013/0271740 A1 | 10/2013 | Quintanilha |
| 2015/0138523 A1 | 5/2015 | Jak et al. |
| 2015/0293458 A1* | 10/2015 | Vanoppen ........... G03F 7/70558 355/53 |
| 2015/0346605 A1* | 12/2015 | Den Boef ............... G03F 9/708 438/401 |
| 2016/0061750 A1 | 3/2016 | Den Boef et al. |
| 2016/0091422 A1 | 3/2016 | Van Der Zouw |
| 2016/0180517 A1 | 6/2016 | Fuchs et al. |
| 2017/0242343 A1 | 8/2017 | Pandey |
| 2017/0248852 A1 | 8/2017 | Warnaar et al. |
| 2018/0173112 A1 | 6/2018 | Jak et al. |
| 2018/0203367 A1 | 7/2018 | Jak |

FOREIGN PATENT DOCUMENTS

| | | |
|---|---|---|
| WO | WO 2013-178422 A1 | 12/2013 |
| WO | WO 2015-185166 A1 | 12/2015 |
| WO | WO 2016-045945 A1 | 3/2016 |
| WO | WO 2016/061128 A1 | 4/2016 |
| WO | WO 2017-144270 A1 | 8/2017 |

OTHER PUBLICATIONS

International Preliminary Report on Patentability directed to related International Patent Application No. PCT/EP2017/080541, dated Jun. 18, 2019; 7 pages.
Non-Final Office Action directed to U.S. Appl. No. 15/839,285, dated Dec. 26, 2019; 18 pages.
Final Office Action directed to U.S. Appl. No. 15/839,285, dated Apr. 14, 2020; 14 pages.
Notice of Allowance directed to U.S. Appl. No. 15/839,285, dated Jul. 1, 2020; 8 pages.
European Search Report for Application No. 16204457.2, dated Sep. 15, 2017; 3 pages.

* cited by examiner (a)

(b)

METHOD OF MEASURING A STRUCTURE, INSPECTION APPARATUS, LITHOGRAPHIC SYSTEM AND DEVICE MANUFACTURING METHOD

CROSS-REFERENCE TO RELATED APPLICATIONS

This is a Divisional of U.S. patent application Ser. No. 15/839,285, filed Dec. 12, 2017, which claims priority of European Application No. 16204457, filed Dec. 15, 2016 which are incorporated herein in their entireties by reference.

BACKGROUND

Field of the Invention

The present invention relates to methods and apparatus for metrology usable, for example, in the manufacture of devices by lithographic techniques, and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions (known as fields) that are successively patterned.

In lithographic processes, it is desirable frequently to make measurements of the structures created, e.g. for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g. intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large gratings, e.g. 40 μm by 40 μm, and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20120242970A1, US20130258310A, US20130271740A and WO2013178422A1. Typically in these methods it is desired to measure asymmetry as a property of the target. Targets can be designed so that measurement of asymmetry can be used to obtain measurement of various performance parameters such as overlay, focus or dose. Asymmetry of the target is measured by detecting differences in intensity between opposite portions of the diffraction spectrum using the scatterometer. For example, the intensities of +1 and −1 diffraction orders may be compared, to obtain a measure of asymmetry.

In these known techniques, appropriate illumination modes and image detection modes are used to obtain the +1 and −1 diffraction orders from periodic structures (gratings) within the target. Comparing the intensity of these opposite diffraction orders provides a measurement of asymmetry of the structure. Comparing the measured asymmetry for two or more gratings with known bias values provides a measurement of overlay in the process by which the structures were formed. By appropriate design of the targets, process performance parameters other than overlay can also be measured by the same technique, for example focus and dose.

Grating structures in metrology targets of the type described may be segmented in a direction other than their main direction of periodicity. Reasons for this segmentation may be to induce asymmetry-related effects to allow measurement of properties other than overlay, in the manner just mentioned. Other reasons for this segmentation may be to make the grating structures more "product-like", so that they are printed with patterning performance more like the product structures that are primarily of interest. Grating structures may simply be completely two-dimensional in layout, for example to resemble an array of contact holes or pillars. Nevertheless, overlay, focus or other parameters of the performance of the patterning process are normally controlled and measured separately in two or more directions, typically the X and Y directions defined relative to the substrate.

In order to reduce measurement time, known apparatuses for dark-field metrology have apertures and detection systems configured to detect simultaneously the radiation diffracted from component gratings in both X and Y directions, and to detect these different directions of diffraction independently. Thus, the need for separate detection steps in X and Y orientation is avoided. Examples of such techniques are included in the prior patent publications mentioned above, and also for example in unpublished patent application EP16157503.0. Unfortunately, where the grating structures in a metrology target are two-dimensionally structured, either being fully two-dimensional gratings or having some kind of segmentation in the orthogonal to their main direction of periodicity, diffraction by a structure in the orthogonal direction becomes mixed with diffraction in the main direction, and the separate measurements become subject to noise or cross-talk. Consequently, a particular method or apparatus may be unusable with such targets, or at least the operating mode has to be changed. To exacerbate this problem, in general it may not even be known to the operator of the metrology apparatus, whether metrology targets under investigation have two-dimensional properties of the type described.

SUMMARY OF THE INVENTION

The present invention in a first aspect aims to allow independent measurement of asymmetry of targets in two directions using available techniques, even when target structures may be two-dimensional in nature. The present invention in another aspect aims to allow recognition of two-dimensional character in metrology targets, without relying on advance information.

The invention in a first aspect provides A method of determining a property of at least a first part of a target structure formed by a lithographic process, the method being based on radiation diffracted by periodic features within the target structure and including the following steps:

(a) using a detection system to form a first image of the target structure when illuminated with radiation having a first angular distribution, the first image being formed using a selected portion of radiation diffracted by the target structure in a first direction and a selected portion of radiation diffracted by the target structure in a second direction, said first and second directions being defined relative to the target structure and being non-parallel;

(b) using the detection system to form a second image of the target structure when illuminated with radiation having a second angular illumination distribution, the first and second angular illumination profiles being oriented differently to one another, relative to the target structure;

(c) combining intensity values from the first image and the second image so as to discriminate between radiation diffracted in the first direction by a first part of the target structure and radiation diffracted in the second direction by the same first part of the target structure; and (d) based at least partly on the discrimination made in step (c), determining the property of said first part of the structure.

In a case where a part of the target has periodic structure in two-dimensions, the discrimination in step (c) allows the presence of this two-dimensional structure to be detected. The discrimination in step (c) can be used instead or in addition to calculate asymmetry of each part of the target structure in the first direction, while disregarding radiation diffracted in the second direction.

The method may further comprise calculating a performance parameter of said lithographic process based on the asymmetry determined by the method for a plurality of periodic structures. The performance parameter may be, for example, overlay, focus or dose.

The invention further provides an inspection apparatus for measuring a property of a target structure formed by a lithographic process on one or more substrates, the inspection apparatus comprising:

an illumination system operable to illuminate a target structure at different times with radiation having a first angular distribution and a second angular distribution;

a detection system operable to form one or more images of the target structure using selected portions of radiation diffracted by the target structure;

a controller for controlling the illumination system and the detection system (a) to form a first image of the target structure when illuminated with radiation having a first angular distribution, the first image being formed using a selected portion of radiation diffracted by the target structure in a first direction and a selected portion of radiation diffracted by the target structure in a second direction, said first and second directions being defined relative to the target structure and being non-parallel and (b) to form a second image of the target structure when illuminated with radiation having a second angular illumination distribution, the first and second angular illumination profiles being oriented differently to one another, relative to the target structure.

The inspection apparatus may further comprise a processor configured (c) to combine intensity values from the first image and the second image so as to discriminate between radiation diffracted in the first direction by a first part of the target structure and radiation diffracted in the second direction by the same first part of the target structure and (d) based at least partly on the discrimination made in step (c), to the property of said first part of the structure.

The invention in another aspect provides various target structures for use in a method according to the invention as set forth above. In one embodiment, said target structure includes at least three parts each periodic in both a first direction and a second direction, the first and second directions being non-parallel, at least two parts among said three parts having different programmed bias values in the first direction and at least two parts among said three parts having different programmed bias values in the second direction.

Because the method of the invention discriminates between asymmetry in different directions, it allows the number of biased gratings to be reduced, relative to a conventional method.

The invention in another aspect provides a processing device arranged to receive at least first and second images of a target structure and to derive a measurement of one or more properties of one or more parts of a target structure by performing the steps (c) and (d) in the method according to the first aspect of the invention as set forth above.

The invention further provides one or more computer program products comprising machine readable instructions for causing a programmable processing device to implement one or more aspects of the invention as set forth above. The machine readable instructions may be embodied, for example, in a non-transitory storage medium.

The invention further provides a lithographic system including a lithographic apparatus and an inspection apparatus according to the invention, as set forth above.

The invention further provides a method of manufacturing devices wherein a device pattern is applied to a series of substrates using a lithographic process, the method including measuring one or more properties of at one or more structures formed as part of or beside said device pattern on at least one of said substrates using a method according to the invention as set forth above, and controlling the lithographic process for later substrates in accordance with the result of the measuring.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
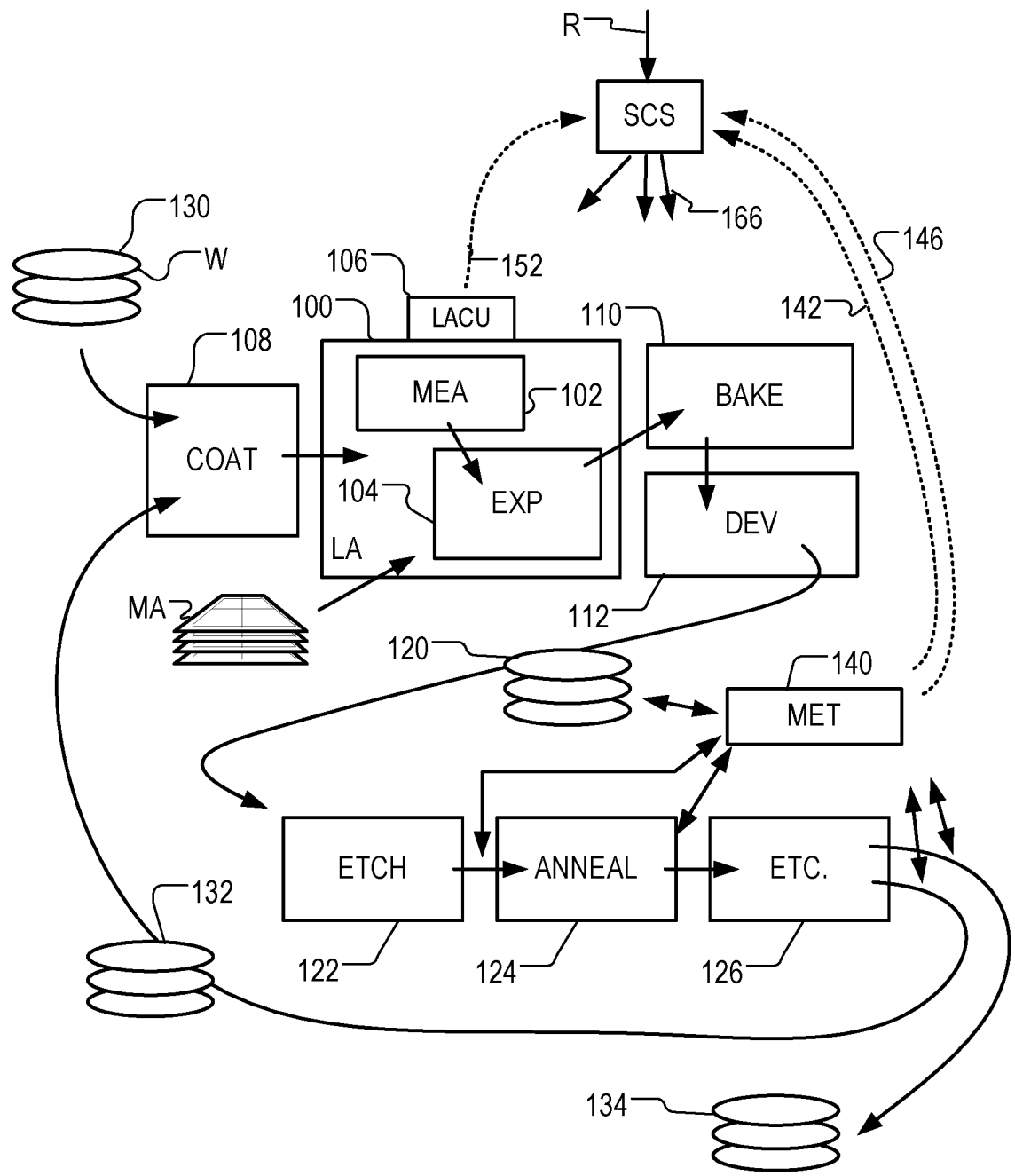
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls the movements and measurements of various actuators and sensors, causing the apparatus LA to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA for example is of a so-called dual stage type which has two substrate tables WTa and WTb and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up, or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Example Inspection Apparatus

FIG. 2(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 2(b).

As described in the prior applications cited in the introduction, the dark-field-imaging apparatus of FIG. 2(a) may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via an objective lens 16. A metrology target T may be formed on substrate W. The objective lens 16 may be similar in form to a microscope objective lens, but has a high numerical aperture (NA), preferably at least 0.9 and more preferably at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that, after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus. In the case of gratings, the structure is periodic. In the case of an overlay metrology target, the grating is printed on top of or interleaved with another grating that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and with the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures 13a, 13b, 13c etc. mounted on a movable slide or wheel. It may alternatively comprise a fixed or programmable spatial light modulator (SLM). As a further alternative, optical fibers may be disposed at different locations in the illumination pupil plane and used selectively to deliver light or not deliver light at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Depending on the illumination mode, example rays 30a may be provided so that the angle of incidence is as shown at 'I' in FIG. 2(b). The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 2(a), the zero order rays of the first and second example illumination modes are labeled 0a and 0b respectively.

As shown in more detail in FIG. 2(b), target grating T as an example of a target structure is placed with substrate W normal to the optical axis O of objective lens 16. In the case of an off-axis illumination profile, a ray 30a of illumination I impinging on grating T from an angle off the axis O gives rise to a zeroth order ray (solid line O) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, the diffracted radiation of each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams were combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Processor and controller PU also generates control signals such as λ and AP, for controlling the illumination characteristics (polarization, wavelength) and for selecting the aperture using aperture device 13 or a programmable spatial light modulator. Aperture stop 21 may also be controlled in the same way. Each combination of these parameters of the illumination and the detection is considered a "recipe" for the measurements to be made.

Referring again to FIG. 2(b) and the illuminating rays 30a, +1 order diffracted rays from the target grating will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Apertures 13c, 13e and 13f in the aperture device 13 of FIG. 2(a) include off-axis illumination in both X and Y directions, and are of particular interest for the present disclosure. Aperture 13c creates what may be referred to as a segmented illumination profile, and may for example be used in combination with a segmented aperture defined for example by a segmented prism 22, described below. Apertures 13e and 13f may for example be used in combination with an on-axis aperture stop 21, in a manner described in some the prior published patent applications, mentioned above.

Figure 2:
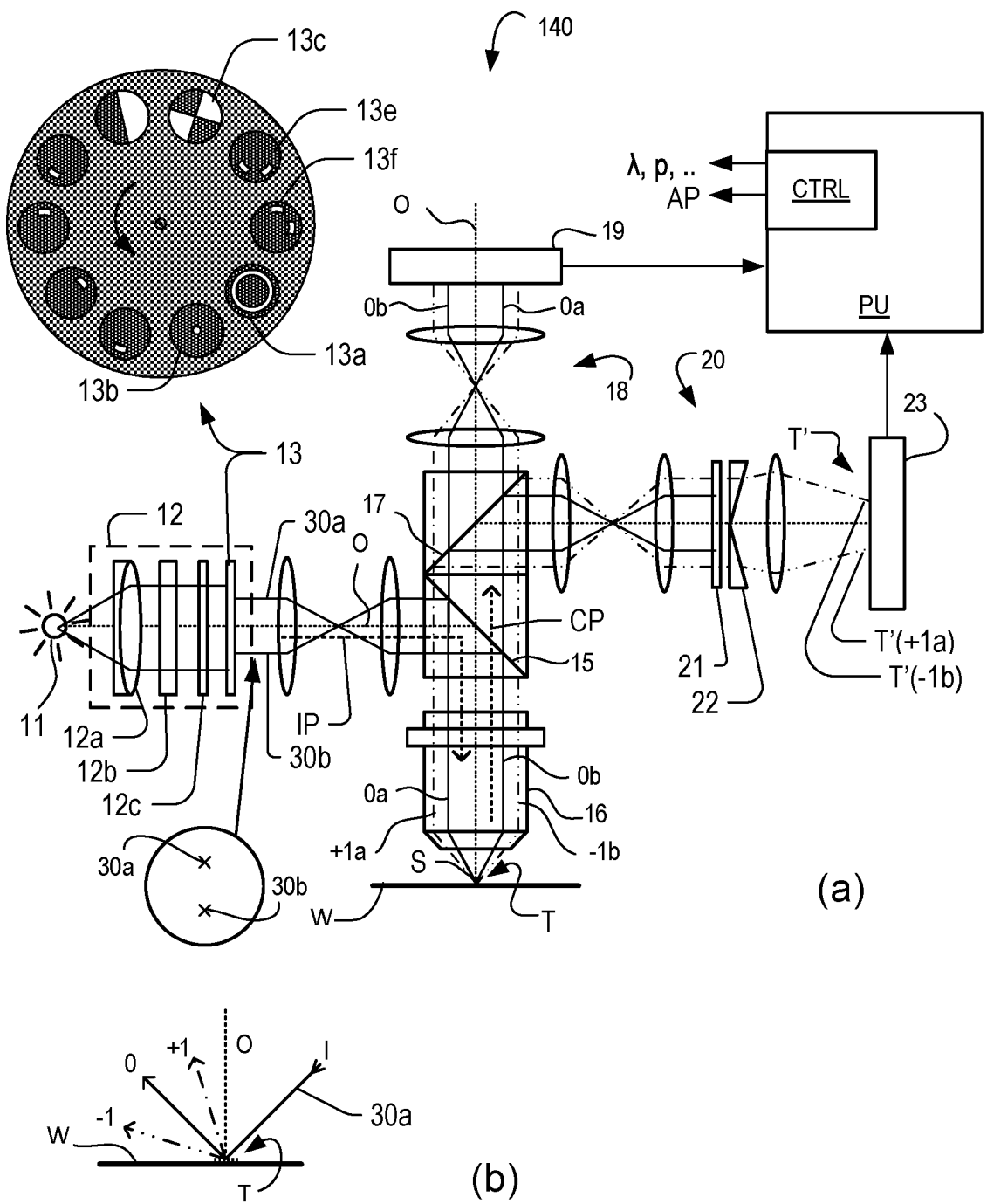
FIG. 2 illustrates schematically (a) an inspection apparatus adapted to perform angle-resolved scatterometry and dark-field imaging inspection methods in accordance with some embodiments of the invention and (b) an enlarged detail of the diffraction of incident radiation by a target grating in the apparatus of FIG. 2(a)

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted light to the sensor. In a further example, a segmented prism 22 is used in combination with an on-axis illumination mode. The segmented prism 22 can be regarded as a combination of individual off-axis prisms, and can be implemented as a set of prisms mounted together, if desired. These prisms define a segmented aperture in which rays in each quadrant are deflected slightly through an angle. This deflection in the pupil plane in has the effect of spatially separating the +1 and −1 orders in each direction in the image plane. In other words, the radiation of each diffraction order and direction forms an image to different locations on sensor 23 so that they can be detected and compared without the need for two sequential image capture steps. Effectively, separate images are formed at separated locations on the image sensor 23. In FIG. 2(a) for example, an image T'(+1a), made using +1 order diffraction from illuminating ray 30a, is spatially separated from an image T'(−1b) made using −1 order diffraction from illuminating ray 30b. This technique is disclosed in the above-mentioned published patent application US20110102753A1, the contents of which are hereby incorporated by reference in its entirety. 2nd, 3rd and higher order beams (not shown in FIG. 2) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

Whichever of these techniques is used, the present disclosure applies to methods in which radiation diffracted in two directions, for example the orthogonal directions called X and Y, is simultaneously captured.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

Image-Based Asymmetry Measurement

Referring to FIG. 3(a), and viewing the pupil plane of the illumination system P(IP) in the vicinity of aperture device 13, aperture 13c has been selected to define a specific spatial profile of illumination, illustrated at 902. In this desired spatial profile of the illumination system, two diametrically opposite quadrants, labeled a and b, are bright, while the other two quadrants are dark (opaque). This spatial illumination profile, when focused to form spot S on the target T, defines a corresponding angular distribution of illumination, in which rays from angles only in these two quadrants. This segmented type of aperture is known in scatterometry apparatus, from the published patent application US 2010/201963. The merits of this modified illumination aperture will be described further below.

When rays from the bright segments of the illumination profile 902 are diffracted by periodic features in a target structure, they will be at angles corresponding to a shift in the pupil plane. Arrows 'x' in FIG. 3 (a) indicate the direction of diffraction of illumination caused by structures periodic in the X direction, while arrows 'y' indicate the direction of diffraction of illumination caused by structures periodic in the Y direction. Arrows '0' indicate direct reflection, in other words zero order diffraction. A feature of this segmented type of aperture is that, with regard to lines of symmetry defined by expected directions of diffraction (X and Y in this example), illuminated regions of the illumination profile are symmetrically opposite dark regions. Therefore there is the possibility to segregate the higher order diffracted radiation, while collecting radiation directed in both directions simultaneously.

FIG. 3(b) illustrates a distribution of illumination in a conjugate pupil plane P(CP) in the collection path of the inspection apparatus. Assume firstly that the target T is a one-dimensional diffraction grating, with a periodicity in the X direction as a first direction. While the spatial profile 902 of the illumination has bright quadrants labeled a and b, the diffraction pattern resulting from diffraction by the lines of the target grating is represented by the pattern at 904 in FIG. 3(b). In this pattern, in addition to zero order reflections labeled $a_0$ and $b_0$ there are first order diffraction signals visible, labeled $a_{+x}$, $b_{-x}$. Because other quadrants of the illumination aperture are dark, and more generally because the illumination pattern has 180° rotational symmetry, the diffraction orders $a_{+x}$ and $b_{-x}$ are "free" meaning that they do not overlap with the zero order or higher order signals from other parts of the illumination aperture (considering only the X direction at this stage). This property of the segmented illumination pattern can be exploited to obtain clear first order signals from a diffraction grating (alignment mark) having a pitch which is half the minimum pitch that could be imaged if a conventional, circularly-symmetric illumination aperture were used.

Now, assume that the target has periodic features in a second direction, for example the Y direction which is orthogonal to the first direction. These features in the second direction may arise from segmentation in the nominally one-dimensional grating, they may also arise from other one-dimensional gratings with Y orientation, that may be present within the area of spot S and the within the field of view of the inspection apparatus. They may also arise from a mixture of these. Assume further that the features periodic in the Y direction have the same period, and therefore the same diffraction angle, as the features periodic in the X direction. The result is diffraction signals $a_{+y}$ and $b_{-y}$ that can be seen in the pupil 904 of the collection path. These signals comprise first order diffraction signals in the Y direction. For simplicity of illustration in the present drawings, the diffraction signals in the Y direction and the X direction are shown as free of one another. In practice, the X diffraction signals and the Y diffraction may overlap in the pupil 904. The reader skilled in the art will understand that this depends on the pitches of the target in X and Y and the chosen wavelength.

Zero order signals $a_0$ and $b_0$ are also present in the pupil of the collection system, as illustrated. Depending whether these zero order signals are wanted or not, they may be blocked by a segmented aperture stop 21, similar in form to aperture 13d. For asymmetry-based measurements, it is generally the higher order signals, for example the +1 and −1 order signals, that are of interest.

As illustrated, the Y direction diffraction signals do not overlap the X direction diffraction signals in the pupil of the collection path, but in other situations they might overlap, depending on the pitch of the grating and the wavelength of illumination. In the case of segmented gratings, the segmentation in one or both directions may be much finer than the pitch of the grating in the other direction. Where very fine segmentation is present, the higher order diffraction signals may fall outside the aperture of the collection path, but scattering of zero order radiation may spill into the quadrants at top left and bottom right. In any case, where two-dimensional features of some kind are present, diffraction signals from two directions are mixed in the same quadrants of the pupil in the collection path.

FIG. 3(c) shows schematically the layout of the segmented prism 22 in the imaging branch of the inspection apparatus of FIG. 2. The circular pupil P(CP) is represented by a dotted circle. In each quadrant of the pupil, a differently angled prism is provided, which deflects the radiation through a certain angle. This angular deflection in the pupil plane translates into a spatial separation of images in the plane of the detector 23, as illustrated already above with reference to FIG. 2(a). The operation of the apparatus in this type of configuration, and some practical benefits and challenges, will now be described in further. The principles of the present disclosure are applicable in other configurations, however.

Figure 4:
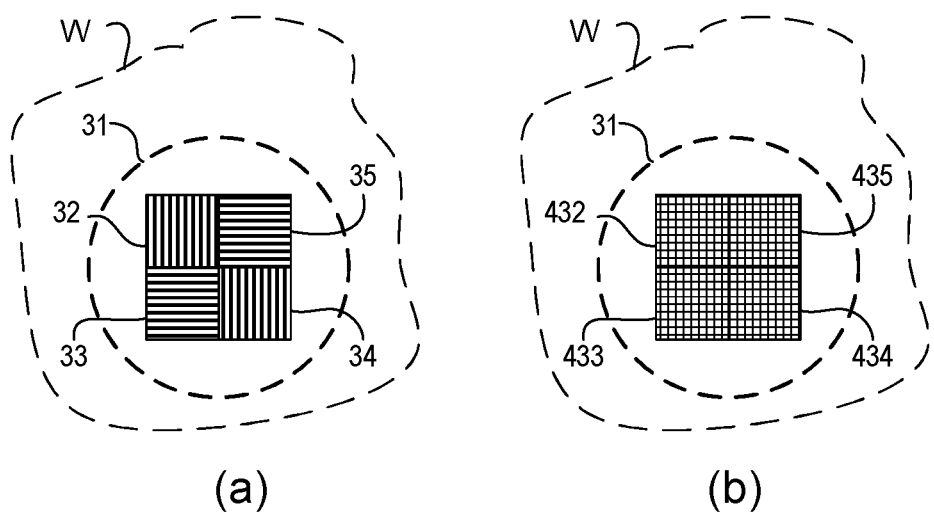
FIG. 4 illustrates a composite metrology target including a number of component gratings (a) in a case where each component grating is periodic in only one direction and (b) in a case where each component grating is or may be periodic in two directions.

FIG. 4 depicts a composite target formed on a substrate W according to known practice. The composite target comprises four gratings 32 to 35 positioned closely together so that they will all be within the measurement spot S formed by the illumination beam of the metrology apparatus. A circle 31 indicates the extent of spot S on the substrate W. The four targets thus are all simultaneously illuminated and simultaneously imaged on sensor 23. In an example dedicated to overlay measurement, gratings 32 to 35 are themselves overlay gratings formed by overlying gratings that are patterned in different layers of the semi-conductor device formed on substrate W. Gratings 32 to 35 may be differently biased, meaning that they have designed-in overlay offsets additional to any unknown overlay error introduced by the patterning process. Knowledge of the biases facilitates measurement of overlay between the layers in which the different parts of the overlay gratings are formed. Gratings 32 to 35 may also differ in their orientation, as shown, so as to diffract incoming radiation in X and Y directions.

In one example, gratings 32 and 34 are X-direction gratings with biases of +d, −d, respectively. This means that grating 32 has its overlying components arranged so that if they were both printed exactly at their nominal locations one of the components would be offset relative to the other by a distance d. Grating 34 has its components arranged so that if perfectly printed there would be an offset of d but in the opposite direction to the first grating and so on. Gratings 33 and 35 are Y-direction gratings with offsets +d and −d respectively. Separate images of these gratings can be identified in the image captured by sensor 23. While four gratings are illustrated, another embodiment might require a larger matrix to obtain the desired accuracy.

Figure 3:
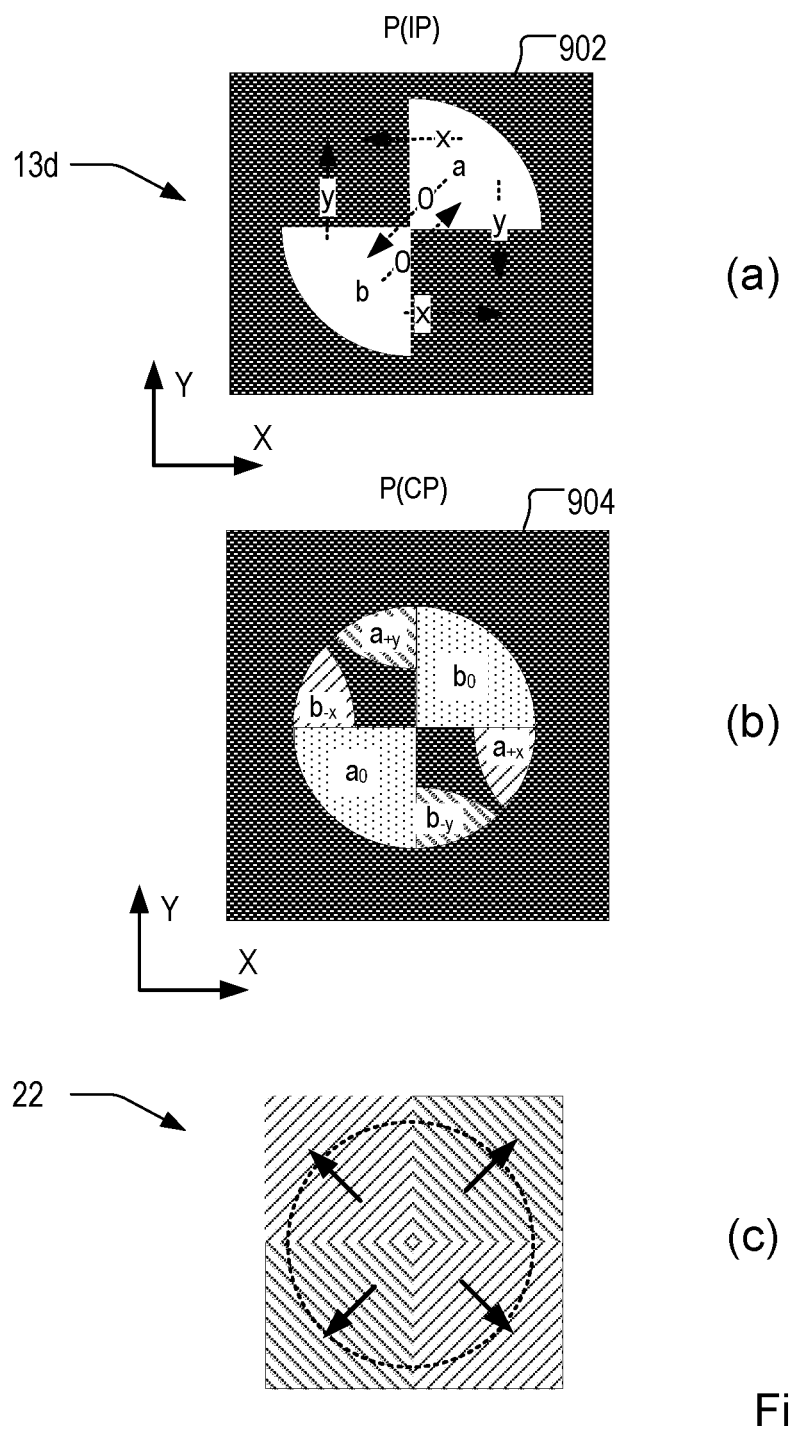
FIG. 3 illustrates (a) a segmented illumination profile, (b) the production of diffraction signals in different directions under the segmented illumination profile and (c) the layout of a prism device in a segmented detection system, all in the operation of one embodiment of the inspection apparatus of FIG. 2.
Figure 5:
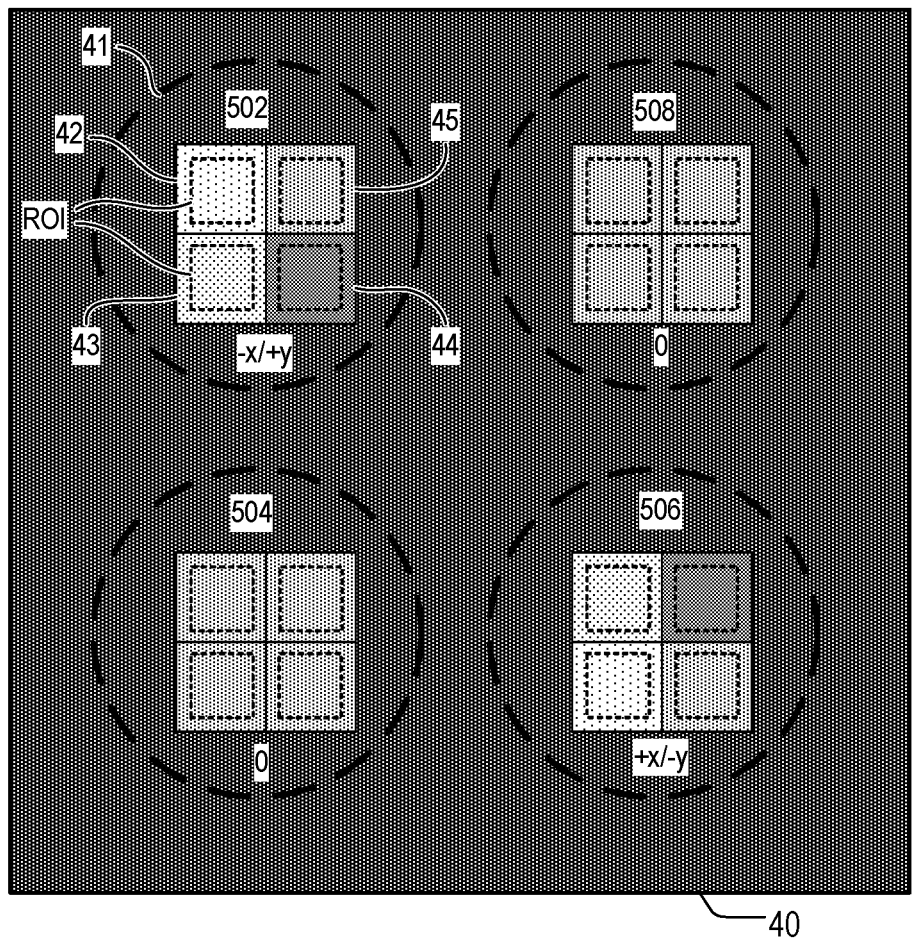
FIG. 5 illustrates a multiple image of the target of FIG. 4, captured by the apparatus of FIG. 4 with spatial separate of diffraction orders.

FIG. 5 shows an example of an image that may be formed on and detected by the sensor 23, using the target of FIG. 4 in the apparatus of FIGS. 2-3, using the segmented illumination profile and using the segmented prisms 22. Such a configuration provides off-axis illumination in both X and Y orientations simultaneously, and permits detection of diffraction orders in X and Y simultaneously, from the quadrants at upper left and lower right of the pupil 904 in FIG. 3(b).

The dark rectangle 40 represents the field of the image on the sensor, within which the illuminated spot 31 on the substrate is imaged into four corresponding circular areas, each using radiation only from one quadrant of the pupil 904 in the collection path CP. Four images of the target are labelled 502 to 508. Within image 502 the image of the illuminated spot 31 using radiation of the upper left quadrant of the pupil 904 is labelled 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole.

As mentioned and as illustrated, because of the action of the segmented prism 22 on the signals in the pupil 904 of the collection path, and because of the segmented illumination profile 902 and its orientation relative to the X and Y directions of the target T, each of the four images 502-508 uses only certain portions of the diffraction spectra of each target. Thus the images 504 and 508 at lower left and upper right respectively are formed of the zero order radiation $a_0$ and $b_0$ respectively. The image 502 is formed of higher order diffracted radiation, specifically radiation diffracted in the negative X direction from bright quadrant b and the positive Y direction from bright quadrant a (diffraction signals $a_{+y}$ and $b_{-x}$). Conversely, image 506 is formed of higher order diffracted radiation, specifically radiation diffracted in the positive X direction from bright quadrant b and the negative Y direction from bright quadrant a (diffraction signals $a_{-y}$ and $b_{+x}$).

From the target comprising only one-dimensional gratings, there is no cross-talk between signals diffracted in the X direction and signals diffracted in the Y direction. That is because each component grating 31-35 diffracts radiation in only one of the two directions, and the image of each grating is spatially separated within the images 502-508 by the imaging action of the optical system. Once the separate images of the gratings have been identified, the intensities of those individual images can be measured, e.g., by averaging or summing selected pixel intensity values within the identified areas (ROIs). Intensities and/or other properties of the images can be compared with one another to obtain measurements of asymmetry for the four or more gratings simultaneously. These results can be combined with knowledge of the target structures and bias schemes, to measure different parameters of the lithographic process. Overlay performance is an important example of such a parameter, and is a measure of the lateral alignment of two lithographic layers. Overlay can be defined more specifically, for example, as the lateral position difference between the center of the top of a bottom grating and the center of the bottom of a corresponding top-grating. To obtain measurements of other parameters of the lithographic process, different target designs can be used. Again, knowledge of the target designs and bias schemes can be combined with asymmetry measurements to obtain measurements of the desired performance parameter. Target designs are known, for example, for obtaining measurements of dose or focus from asymmetry measurements obtained in this way.

Problems with Two-Dimensional Targets

Referring now to FIG. 4(b), as mentioned above, some targets will scatter or diffract radiation in two directions within the same part of the image. The target of FIG. 4(b) has two-dimensional structures in each of the four component gratings 432-435. The two dimensional structures may arise from segmentation in a one-dimensional grating in one or more layers. The two-dimensional structures may arise from gratings representing arrays of contact holes or vias, for example.

Although diffraction will therefore occur in both directions X and Y, within each grating image 42-45, nevertheless the purpose of the metrology target is to measure a parameter such as overlay separately in each of the X and Y directions. The contribution of diffraction from the other direction, in the same part of the image, represents "contamination" or noise in the wanted diffraction signals. In the overlay measurement we derive X-Overlay from the asymmetry (difference between +1st and −1st order diffraction) in the X direction. The added radiation from diffraction in the Y direction leads to a worse signal to noise ratio. If the segmentation is present in both layers (or has an asymmetric shape), the added diffraction will not just add light, but also add asymmetry. This will lead to measurement errors, on top of the signal to noise degradation.

In the case of a two-dimensional overlay grating, bias values can be set separately in X and/or Y directions.

Discriminating Asymmetry of Diffraction in Different Directions

Figure 6:
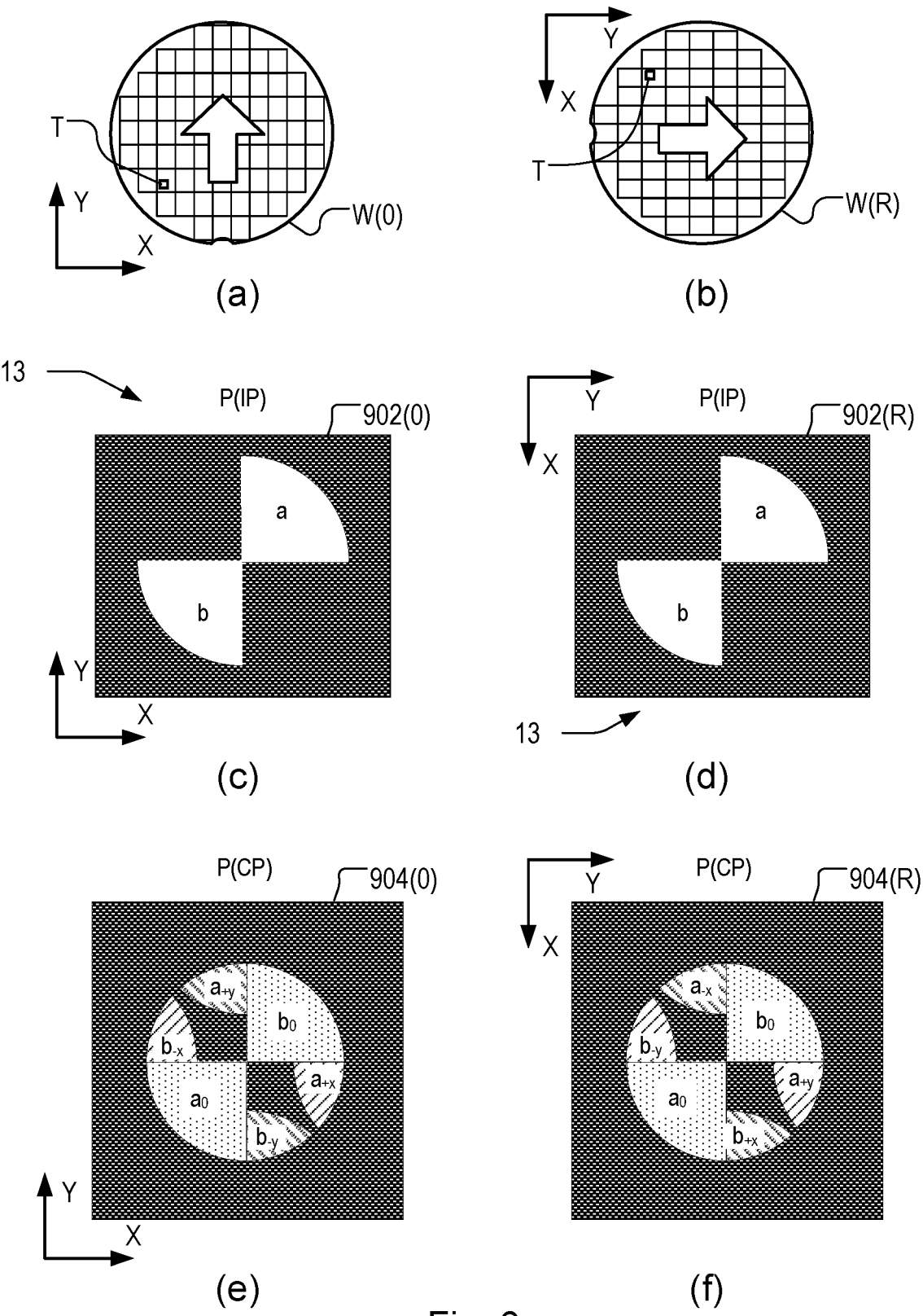
FIG. 6 illustrates (a)-(f) the production of diffraction signals similar to FIG. 3, but using a second illumination profile to discriminate between radiation diffracted in different directions by the same part of the target, in accordance with the principles of the present disclosure.

Referring now to FIG. 6, a method according to the present disclosure addresses the problem identified above. Embodiments based on this principle can bring one or both of the following benefits:

1) Prevent measurement errors due to the added diffraction from the second direction 2) Provide a means to detect the presence of the additional Y-signal, so that extra measures can be taken when needed.

With regard to the second benefit, it was noted above that it may not even be known a priori, whether a target has structure in two directions or one.

The inventors have realized that the asymmetry created by diffraction in a first direction (e.g. the X direction) can be separated from the diffraction in a second direction (e.g. the Y direction) by combining measurements made using two different angular distributions of illumination, relative to the target structure. In particular embodiments, it is convenient to use two orientations of the same illumination profile, which is the method illustrated in FIG. 6. At the left hand side in FIG. 6, parts (a), (c), (e) illustrate the configuration shown in FIG. 3, while at the right had side parts (b), (d), (f) illustrates a second configuration which implements a similar measurement but uses a second angular illumination profile. Using these two angular illumination profiles in combination, the signals caused by diffraction in the different directions can be discriminated. In the example of FIG. 6, these different angular illumination profiles are implemented by different rotational positions of the substrate, relative to the optical system of the inspection apparatus.

FIG. 6(a) shows a first orientation of substrate W and target T (zero degrees, suffix '0'), while (b) shows a second orientation of substrate W and target T (ninety degrees, suffix 'R'). FIGS. 6(c) and (d) shows how the resulting illumination profiles 902(0) and 902(R) are the same relative to the optical system, but are rotated relative to the directions X and Y defined by the target structure. FIGS. 6(e) and (f) show how the distribution of radiation in each quadrant of the pupils 904(0) and 904(R) is therefore similar, but contains different orders of diffraction. From images detected using these two angular illumination profiles, the signals caused by diffraction in the different directions can be discriminated.

Figure 7:
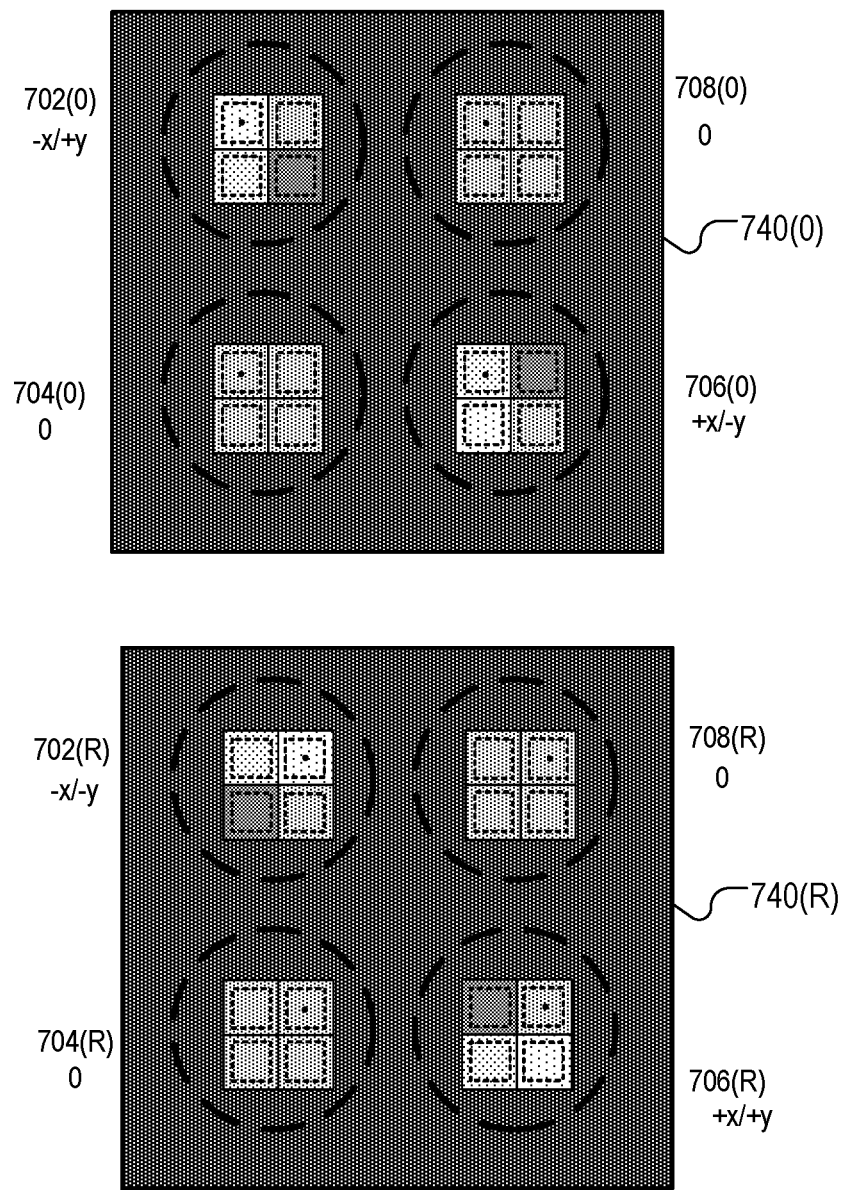
FIG. 7 illustrates dark-field images obtained using the first and second illumination profiles of FIG. 6.

FIG. 7 shows the images 740(0) and 740(R) obtained by the two image capture steps illustrated in FIG. 6. Image 740(0) is the same as that shown in FIG. 5, with four spatially separated images 702(0)-708(0) of the target. As described already for FIG. 5, the image 702(0) is formed of radiation diffracted by the target in the negative X direction and the positive Y direction (labelled −x/+y). Image 706(0) is formed of radiation diffracted in the positive X direction and the negative Y direction (+x/−y). These images 702(0)-708(0) will (for the same target and measurement conditions) be the same as images 502-508 shown in FIG. 5. On the other hand, due to the different orientation of the target T in capturing image 740(R), images 702(R) to 708(R) within image 740(R) will have different combinations of diffraction orders. With the axes and labelling conventions adopted above, the image 702(R) will be formed of radiation diffracted by the target in the negative X direction and the negative Y direction (labelled −x/−y). Image 706(R) will be formed of radiation diffracted in the positive X direction and the positive Y direction (+x/+y).

In the case where these images are obtained by rotating the target structure under the same illumination profile, the arrangement of the different parts of the target structure will also be rotated within the images 702(R) to 708(R), compared with the arrangement in images 702(0) to 708(0). This rotation can be taken into account when selecting the pixels and ROIs to combine their intensities. To illustrate this, a dot in each image indicates the part corresponding to the first component grating 32.

Now, if we consider how the intensities of the individual grating areas within the image are conventionally used to calculate overlay OV from a pair of biased gratings, we use the formula:

$$OV = \operatorname{atan}\left(\frac{A_{+d} + A_{-d}}{A_{+d} - A_{-d}} \cdot \tan(d)\right) \quad (1)$$

where $A_{+d}$ is asymmetry measured between the intensity of opposite diffraction order images of a component grating with bias +d and $A_{-d}$ is asymmetry measured between opposite diffraction order images of a component grating with bias −d. In Equation (1), the offset d is expressed as an angle, relative to 2π radians representing the period of the grating.

If each grating is only one-dimensional, as in FIG. 3(a), then a single captured image 40 as shown in FIG. 5 has the complete information required to obtain independent measurements of overlay OV with respect to the X and Y directions. In the case where a grating in the target has two-dimensional structure, however, the diffraction signals for different directions become mixed as described above. Fortunately, by capturing the two images 740(0) and 740(R), the signals for the two directions can be separated by a simple calculation. What is wanted is to obtain the directional asymmetry values $A_x$ and $A_y$, which are the differences in the intensities of the +1 and −1 diffraction orders only for the X direction and only for the Y direction, respectively.

For any and each of the component gratings 432-435, four higher order diffraction intensities are available:

$I_{-x/+y}$ from the image 702(0)
$I_{+x/-y}$ from the image 706(0)
$I_{-x/-y}$ from the image 702(R) and
$I_{+x/+y}$ from the image 706(R).

Although the different directional asymmetries are mixed in each of the captured images, the nature of the mixing is slightly different. By combining information from the two images 740(0) and 740(R), the separate contributions for each direction, specifically the desired directional asymmetry values $A_x$ and $A_y$, can be separated. Defining asymmetries A(0) and A(R) as asymmetries measured from the two images and combining them with the definitions of the desired directional asymmetry values $A_x$ and $A_y$ we obtain:

$$A(0)=I_{-x/+y}-I_{+x/-y}=-A_x+A_y \quad (2)$$

$$A(R)=I_{+x/+y}-I_{-x/-y}=A_x+A_y \quad (3)$$

From this, the directional asymmetry values can be recovered using formulae:

$$A_x=-A(0)+A(R) \quad (4)$$

$$A_y=A(0)+A(R) \quad (5)$$

In this way, the asymmetry of diffraction orders in a first direction (for example the X direction) is discriminated from the asymmetry of diffraction orders in the second direction (Y). Using these directional asymmetry values for differently biased gratings in the formula of Equation (1), overlay values specific to each direction can be obtained for the gratings of interest. Separate directional overlay values can also be obtained for two-dimensional gratings, if the biases in X and Y are separately known, as explained in the application examples below.

Also, from this information, the two-dimensional character of a grating can be identified, where it may not have been known before. For example, based on the observation of a significant asymmetry signal $A_y$ for a grating which is nominally an X direction grating, an inference can be made that this grating has segmentation in the Y direction. The presence or absence of two-dimensional features in an individual target or a group or class of targets can be decided, for example, based on a threshold of asymmetry signals observed in the second direction. Strictly speaking, if a grating has segmentation in the Y direction, but is perfectly symmetrical in the Y direction, then this would not be detected. However, in that hypothetical case, it would also not cause any error in the measurement of asymmetry-related parameters in the X direction, and so its two-dimensional character would be of academic interest only.

In all the above equations, some scaling factors and normalization factors are omitted for simplicity. For example, as described in some of the prior published applications mentioned above, it may be convenient to normalize the differences between intensities using the average of those intensities as a denominator. So, for example, where above is written:

$$A(0)=I_{-x/+y}-I_{+x/-y}=-A_x+A_y \quad (2)$$

the full expression might be:

$$A(0)=2(I_{-x/+y}-I_{+x/-y})/(I_{-x/+y}+I_{+x/-y})=-A_x+A_y \quad (2')$$

The person skilled in the art can incorporate these practical details with routine skill and knowledge.

Application Examples

Figure 8:
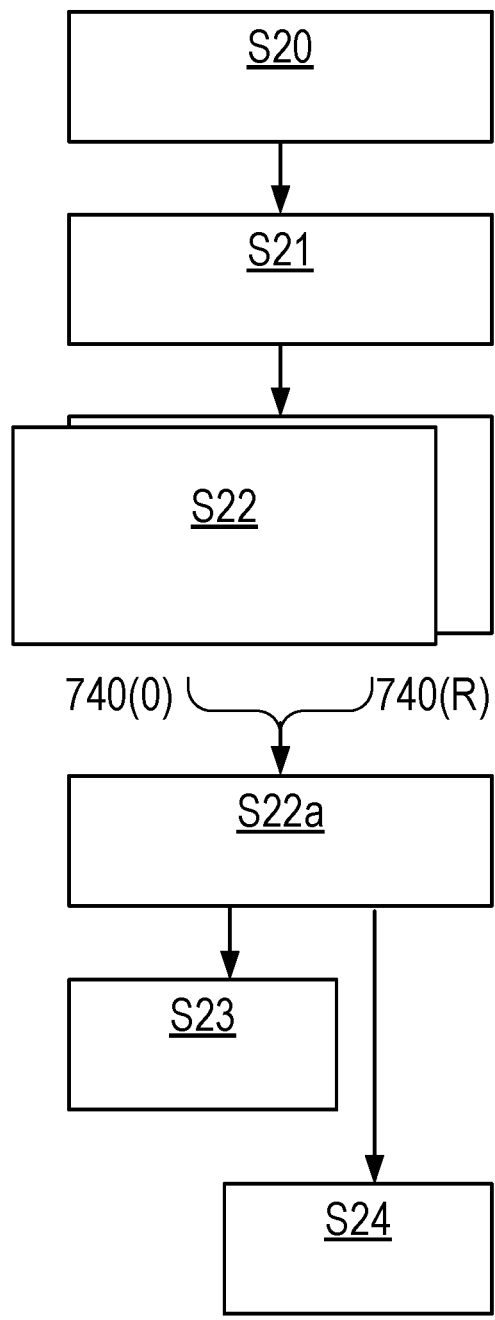
FIG. 8 is a flowchart of a method of measuring a property of a target structure and a method of controlling a lithographic process using the principles of FIG. 6.

FIG. 8 illustrates a method of measuring performance of a lithographic process using the apparatus and methods outlined above. In step S20, one or more substrates are processed to produce target structures such as the composite grating targets described above. The design of target can be any of the known designs, such as those shown in FIG. 4(a) or (b) or new designs, examples of which are described below. Targets may be large target or small target designs, depending whether the first measurement branch or second measurement branch of the apparatus is to be used. Targets may be composite targets with distinct periodic structures in distinct areas. Targets may be designed for measurement of overlay, focus or dose through asymmetry. Targets may be designed for measurement of other performance parameters and/or non-asymmetry-related parameters. Linewidth or critical dimension CD is an example of a parameter that may be measured by scatterometry other than through measurement of asymmetry.

At step S20, structures are produced across a substrate using the lithographic manufacturing system, and the substrate is loaded into an inspection apparatus, such as the inspection apparatus of FIG. 2. In step S21 metrology recipes are defined, including a recipe for measurement using two or more illumination profiles, such as the rotated profiles as described above with reference to FIG. 6. All the usual parameters of such a recipe are also defined, including the polarization, angular distribution and so forth. In other embodiments, more than two different angular distributions of illuminating radiation (illumination profiles) may be defined. As already mentioned, the illumination profiles are different relative to the directions defined by the target orientation. Therefore the recipes may in practice specify different orientations of the substrate relative to the optical system, rather than changing the illumination profile within the optical system. Alternatively, for example, the segmented aperture 13c may be rotatable through ninety degrees or two rotated versions of it may be provided for selection in the aperture device 13.

In step S22, the inspection apparatus is operated to capture two or more dark-field images (such as images 740(0) and 740(R) in FIG. 7) using the specified illumination profiles. Properties such as asymmetry values A(0) and A(R) are calculated from the captured images of one or more targets.

At step S22a one or more directional asymmetry values $A_x$ and $A_y$ are calculated for one or more target structures, by selecting and/or combining signals from the two or more dark-field images. These directional asymmetry values can be used to calculate one or more parameters of interest relating to the target structures and/or relating to the performance of the lithographic process by which the target structures have been formed. Parameters of interest include directional overlay values, and values for dose and focus, for example. By discriminating between radiation diffracted in a direction of interest and radiation diffracted in a different, non-parallel direction, noise is reduced in the asymmetry measurements, leading to more accurate measurements of a performance parameter such as overlay, focus and/or dose. Parameters of interest may be simply whether the image of a target structure contains a mixture of radiation diffracted in two directions or not.

At step S23, the metrology recipe may be updated in response to the obtained measurements and ancillary data. For example, the metrology techniques for a new product or target layout may be under development. Information about the two-dimensional characteristics can be used to select the appropriate recipe. The recipe may not need an image to be captured with different illumination profiles, if radiation diffracted in a second direction is found to be absent or insignificant. Even if significant structure is present in the second direction, a recipe with different wavelength and/or polarization may minimize the amount of radiation diffracted in the second direction that gets mixed with diffraction in the second direction.

In step S24, in a development and/or production phase of operating the lithographic production facility of FIG. 1, recipes for the lithographic process may be updated, for example to improve overlay in future substrates. The ability to discriminate between radiation diffracted in different directions allows the efficient measurement techniques using segmented detection systems to be applied even when target structures have significant two-dimensional structure. An inspection apparatus can be used with a fixed, segmented detection system, while covering a full range of targets, reducing cost and size of the apparatus.

The calculations to obtain measurements, and to control the selection of wavelengths and other recipe parameters, can be performed within the image processor and controller PU of the inspection apparatus. In alternative embodiments, the calculations of asymmetry and other parameters of interest can be performed remotely from the inspection apparatus hardware and controller PU. They may be performed for example in a processor within supervisory control system SCS, or in any computer apparatus that is arranged to receive the measurement data from the processor and controller PU of the inspection apparatus. Control and processing of the calibration measurements can be performed in a processor separate from that which performs high-volume calculations using the correction values obtained. All of these options are a matter of choice for the implementer, and do not alter the principles applied or the benefits obtained. Use of the term "processor" in the description and claims should be understood also to encompass a system of processors.

Alternative Target Layouts

As mentioned above, a particular goal of this disclosure as presented above is to allow for directional measurements of overlay and the like on segmented targets. However, the directional discriminating power of the disclosed techniques can also be applied to obtain performance parameters such as overlay in two different directions from the same target structure. A target with a two-dimensional grating pattern can be combined with known biases in both directions, and an asymmetry-related parameter such overlay can be determined separately in both directions.

Figure 9:
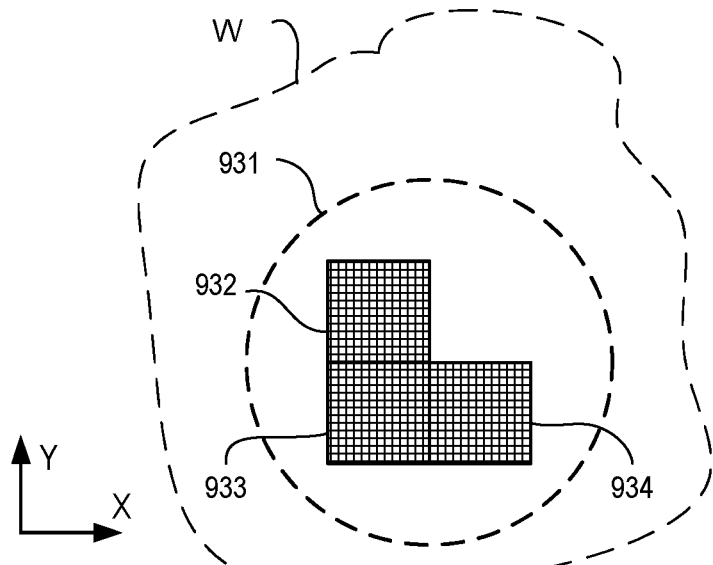
FIG. 9 illustrates (a)-(b) some modified target layouts designed for use in the method of FIG. 8.
Figure 9:
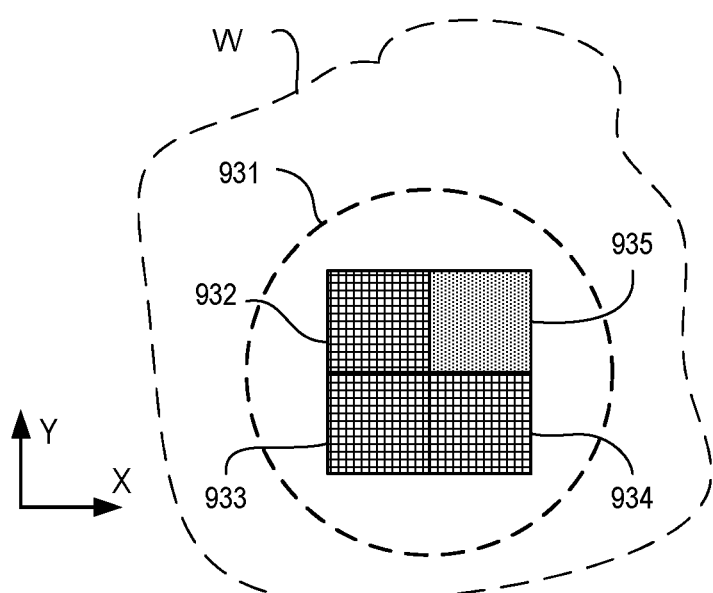

As illustrated in FIG. 9, an advantage of such a target and detection method can be that it needs only three gratings instead of four gratings to measure overlay in both directions. (Alternatively, instead of needing nine gratings to accommodate 3 bias values in each of two directions, only six might be needed.) Since metrology overhead is very expensive in "real estate" as well as in measurement time, such a saving in target area could be very advantageous.

In FIG. 9(a), an illumination spot 931 is shown illuminating a composite target is shown having three overlay gratings, 932-934. Two or more of these gratings are provided with different overlay bias values in a first direction and two or more of these gratings are provided with different overlay bias values in a second direction. As a first examples of bias combinations that may be used, the two-dimensional bias (dx, dy) may be as follows for the three targets:

$$(dx, dy) = (+20 \text{ nm}, +20 \text{ nm})$$
$$(-20 \text{ nm}, +20 \text{ nm})$$
$$(+20 \text{ nm}, -20 \text{ nm})$$

It will be seen that, using the method of FIGS. 6 to 8 to discriminate between asymmetry in different directions, overlay measurements independent in X and Y can be obtained from only three gratings, where the prior techniques require four gratings, as shown in FIG. 4.

Another example bias scheme is:

$$(dx, dy) = (+20 \text{ nm}, +20 \text{ nm})$$
$$(-20 \text{ nm}, +20 \text{ nm})$$
$$(0 \text{ nm}, -20 \text{ nm})$$

Several other combinations are also possible. As long as the 3 points (dx, dy) are not on a straight line, then the overlay in the two directions can be independently measured.

In some applications, symmetry signals (e.g. average intensity of opposite diffraction orders) are used in addition to asymmetry signals, for example to characterize the target in some way. Using the above reduced number of targets, these symmetry signals cannot be separated between X and Y. For this reason, it may be preferred to have equal pitch of the periodic structures in X and Y directions, so that those symmetric signals are roughly equal for X and Y.

In some applications, it can be useful to measure asymmetry in two directions on a single grating structure that is not an overlay grating. Targets designed for measurement of dose or focus, for example, may be designed to exhibit asymmetry in a single layer grating. As another example of a single layer structure for which asymmetry is of interest, it is sometimes desirable to form an auxiliary target structure alongside a set of biased overlay gratings, which is identical in the bottom layer, but has no overlying top grating. This structure can be used to measure directly the bottom grating asymmetry (BGA) which could otherwise become confused with a genuine overlay error. The technique of FIGS. 6-8 can be used to measure the asymmetry of this bottom grating structure independently in both directions. Using the measured BGA, the overlay measurements based on asymmetry can be corrected to more accurately reflect the true overlay error between the top and bottom gratings. In principle, top grating asymmetry could be measured in the same way, but the more common problem is that of asymmetry introduced in the bottom grating, which may be subjected to several chemical and physical processing steps, prior to formation of the top grating.

FIG. 9(b) illustrates a composite target the same as that shown in FIG. 9(a), but with a fourth target structure 935 occupying the fourth quarter of an overall square outline. Such a fourth structure may for example be the bottom grating asymmetry target mentioned above, or some other auxiliary target structure. In this way, where adding an auxiliary target structure conventionally incurs an additional space penalty, the auxiliary target structure can be added to a three-grating target and only occupies the same amount of space as the known targets.

The method of FIGS. 6-8 can also be used for example to measure a target consisting of a line grating in the bottom layer periodic in a first direction (e.g. X) and another line grating in the top layer that is periodic in a second direction (e.g. Y). This would allow the apparatus to measure the bottom grating asymmetry (BGA) in X and the top grating asymmetry in Y both from the same piece of target area.

Finally, as mentioned above, while the above techniques can be used to measure a property of the target independently in two directions, it may also be used as a simple check to see if segmentation or other structure is present in a second direction. If not, then the normal single orientation measurement can be reliably executed. If the segmentation signal is present in the second direction, the measurement for that type of target can be subsequently executed in the mode described above or by alternative methods.

CONCLUSION

The principles disclosed above allow directional measurement accuracy to be maintained when target structures having strong two-dimensional characteristics. The technique is suitable for application in asymmetry measurements to be made by dark field imaging methods, using segmented detection systems, as well as other methods. Use of two or more angular distributions of illumination allows the simple and efficient inspection apparatus based on a segmented detection system to operate with a full range of targets, including those having significant diffraction in a second direction.

Additionally, the disclosed method an apparatus can determine properties in two directions independently with a reduced number of biased targets and hence with a saving in space on the substrate.

Additionally, the disclosed method and apparatus can deliver information about the previously—unknown two-dimensional character of the target structures. Such information may allow information about the performance of the lithographic process to be derived, or at least it may allow selection of appropriate recipes.

While specific embodiments of the invention have been described above, it will be appreciated that the invention may be practiced otherwise than as described.

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being reconfigured by movable elements to serve as a pupil plane image sensor and then a substrate plane image sensor.

While the optical system illustrated in FIG. 2 comprises refractive elements, reflective optics can be used instead. For example the use of reflective optics may enable the use of shorter wavelengths of radiation.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the inspection apparatus hardware and suitable periodic structures realized on substrates and patterning devices, an embodiment may include a computer program containing one or more sequences of machine-readable instructions implementing methods of measurement of the type illustrated above to obtain information about a target structure and/or about a lithographic process. This computer program may be executed, for example, within image processor and controller PU in the apparatus of FIG. 2 and/or the control unit LACU of FIG. 1. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments according to the invention are described in below numbered clauses:

1. A method of determining a property of at least a first part of a target structure formed by a lithographic process, the method being based on radiation diffracted by periodic features within the target structure and including the following steps:
   (a) using a detection system to form a first image of the target structure when illuminated with radiation having a first angular distribution, the first image being formed using a selected portion of radiation diffracted by the target structure in a first direction and a selected portion of radiation diffracted by the target structure in a second direction, said first and second directions being defined relative to the target structure and being non-parallel;
   (b) using the detection system to form a second image of the target structure when illuminated with radiation having a second angular illumination distribution, the first and second angular illumination profiles being oriented differently to one another, relative to the target structure;
   (c) combining intensity values from the first image and the second image so as to discriminate between radiation diffracted in the first direction by a first part of the target structure and radiation diffracted in the second direction by the same first part of the target structure; and (d) based at least partly on the discrimination made in step (c), determining the property of said first part of the structure.

2. A method according to clause 1 wherein, based on the discrimination in step (c), step (d) determines whether the first part of the target structure is configured to cause significant asymmetrical diffraction in the second direction.

3. A method according to clause 1 wherein, based on the discrimination in step (c), step (d) determines said property of the first part of the target structure based on the radiation diffracted in the first direction by the first part of the target structure and disregarding the effect of the radiation diffracted in the second direction by the same first part of the target structure.

4. A method according to clause 3 wherein said property is related to asymmetry of the first part of the target structure in the first direction.

5. A method according to clause 4 wherein said property related to asymmetry of the part of the target structure in the first direction is calculated based at least partly on a difference of intensity between complementary portions of said first image and complementary portions of said second image, the complementary portions in each image being images of the first part of the target structure formed using opposite diffraction orders of the radiation diffracted in the first direction.

6. A method according to clause 5 further comprising determining said property related to asymmetry for at least a second part of the target structure and calculating a measurement of a first performance parameter of the lithographic process based on the property determined for the first part and the second part of the target structure and based on known bias properties of the first part and the second part of the target structure in the first direction.

7. A method according to clause 5 or 6 further comprising determining a second property of the first part of the target structure, the second property being related to asymmetry in the second direction.

8. A method according to clause 7 further comprising determining said second property related to asymmetry of at least a second part of the target structure in the second direction and calculating a measurement of a second performance parameter of the lithographic process based on the properties determined for the first part and the second part of the target structure and based on known bias properties of the first-mentioned part and the second part of the target structure in the second direction.

9. A method according to clause 8 further comprising a step:

(e) combining intensity values from the first image and the second image so as to discriminate between radiation diffracted in the second direction by a third part and a fourth part of the target structure and radiation diffracted in the first direction by the same third part and fourth part of the target structure; and (f) based on the discrimination made in step (e), calculating properties of said third and fourth parts of the target structure related to asymmetry of the third and fourth parts of the target structure in the second direction, and calculating a measurement of a third performance parameter of the lithographic process based on the properties determined for the third and fourth parts of the target structure and based on known bias properties of the third and fourth parts of the target structure.

10. A method according to any preceding clause wherein said first angular distribution of radiation is derived from a segmented illumination profile having illuminated regions and dark regions, each illuminated region being symmetrically opposite a dark region, when reflected in the first direction and when reflected in the second direction.

11. A method according to clause 10 wherein said segmented illumination profile has four quadrants, said illuminated regions falling only within two quadrants diametrically opposite one another.

12. A method according to clause 10 or 11 wherein said detection system is a segmented detection system, whereby each of said first image and said second image, includes complementary portions which are images of the target structure structures formed using opposite diffraction orders of the radiation diffracted by the target structure.

13. A method according to any preceding clause wherein said target structure comprises two or more parts each with different programmed bias values only in said first direction and two or more parts each with different programmed bias values only in said second direction.

14. A method according to any of clauses 1 to 12 wherein said target structure comprises three or more parts each periodic in both the first direction and the second direction, the different parts having different combinations of programmed bias values in the first direction and in the second direction.

15. A method according to any of clauses 1 to 12 wherein said target structure includes three parts each periodic in both the first direction and the second direction, at least two parts among said three parts having different programmed bias values in the first direction and at least two parts among said three parts having different programmed bias values in the second direction.

16. A method clause 15 wherein each of said three parts is an overlay grating comprising grating structures formed in two or more layers and wherein said target structure further comprises a fourth part comprising a grating structure formed in only one of said layers.

17. A method according to clause 16 wherein said target structure has a rectangular layout divided into similar quarters, wherein said three parts are arranged in three quarters of the rectangular layout and said fourth part is arranged in a fourth quarter.

18. A method according to clause 17 wherein said rectangular layout is a substantially square layout and said quarters are generally square.

19. A method according to any preceding clause further comprising using the determined property to modify a metrology recipe for measuring further target structures.

20. A method according to any preceding clause further comprising using the determined property to control a lithographic apparatus to apply patterns to substrates.

21. An inspection apparatus for measuring a property of a target structure formed by a lithographic process on one or more substrates, the inspection apparatus comprising:

an illumination system operable to illuminate a target structure at different times with radiation having a first angular distribution and a second angular distribution;

a detection system operable to form one or more images of the target structure using selected portions of radiation diffracted by the target structure; a controller for controlling the illumination system and the detection system (a) to form a first image of the target structure when illuminated with radiation having a first angular distribution, the first image being formed using a selected portion of radiation diffracted by the target structure in a first direction and a selected portion of radiation diffracted by the target structure in a second direction, said first and second directions being defined relative to the target structure and being non-parallel and (b) to form a second image of the target structure when illuminated with radiation having a second angular illumination distribution, the first and second angular illumination profiles being oriented differently to one another, relative to the target structure.

22. An inspection apparatus according to clause 21 further comprising a processor configured (c) to combine intensity values from the first image and the second image so as to discriminate between radiation diffracted in the first direction by a first part of the target structure and radiation diffracted in the second direction by the same first part of the target structure and (d) based at least partly on the discrimination made in step (c), to the property of said first part of the structure.

23. An inspection apparatus according to clause 22 wherein said property is related to asymmetry of the first part of the target structure in the first direction.

24. An inspection apparatus according to clause 23 wherein said processor is configured to calculate said property related to asymmetry of the part of the target structure in the first direction based at least partly on a difference of intensity between complementary portions of said first image and complementary portions of said second image, the complementary portions in each image being images of the first part of the target structure formed using opposite diffraction orders of the radiation diffracted in the first direction.

25. An inspection apparatus according to clause 24 wherein said processor is further configured to calculate said property related to asymmetry for at least a second part of the target structure and calculating a measurement of a first performance parameter of the lithographic process based on the property determined for the first part and the second part of the target structure and based on known bias properties of the first part and the second part of the target structure in the first direction.

26. An inspection apparatus according to clause 24 or 25 wherein said processor is further configured to determine a second property of the first part of the target structure, the second property being related to asymmetry in the second direction.

27. An inspection apparatus according to clause 26 wherein said processor is further configured to determine said second property related to asymmetry of at least a second part of the target structure in the second direction and to calculate a measurement of a second performance parameter of the lithographic process based on the properties determined for the first part and the second part of the target structure and based on known bias properties of the first-mentioned part and the second part of the target structure in the second direction.

28. An inspection apparatus according to clause 27 wherein said processor is further configured (e) to combine intensity values from the first image and the second image so as to discriminate between radiation diffracted in the second direction by a third part and a fourth part of the target structure and radiation diffracted in the first direction by the same third part and fourth part of the target structure and (f) based on the discrimination made in step (e), to calculate properties of said third and fourth parts of the target structure related to asymmetry of the third and fourth parts of the target structure in the second direction, and to calculate a measurement of a third performance parameter of the lithographic process based on the properties determined for the third and fourth parts of the target structure and based on known bias properties of the third and fourth parts of the target structure.

29. An inspection apparatus according to any of clauses 21 to 28 wherein said illumination system is operable to form said first angular distribution of radiation using a segmented illumination profile having illuminated regions and dark regions, each illuminated region being symmetrically opposite a dark region, when reflected in the first direction and when reflected in the second direction.

30. An inspection apparatus according to clause 29 wherein said segmented illumination profile has four quadrants, said illuminated regions falling only within two quadrants diametrically opposite one another.

31. An inspection apparatus according to clause 29 or 30 wherein said detection system is a segmented detection system, whereby each of said first image and said second image, includes complementary portions which are images of the target structure structures formed using opposite diffraction orders of the radiation diffracted by the target structure.

32. An inspection apparatus according to clause 31 wherein said segmented detection system includes a segmented prism in a pupil plane of the detection system for deflecting said opposite diffraction orders through different angles, thereby to form said complementary portions with a spatial separation in an image plane of the detection system.

33. A target structure for use in a method according to any of clauses 1 to 20 wherein said target structure includes at least three parts each periodic in both a first direction and a second direction, the first and second directions being non-parallel, at least two parts among said three parts having different programmed bias values in the first direction and at least two parts among said three parts having different programmed bias values in the second direction.

34. A target structure according to clause 33 wherein each of said three parts is an overlay grating comprising grating structures formed in two or more layers and wherein said target structure further comprises a fourth part comprising a grating structure formed in only one of said layers.

35. A target structure according to clause 34 wherein said target structure has a rectangular layout divided into similar quarters, wherein said three parts are arranged in three quarters of the rectangular layout and said fourth part is arranged in a fourth quarter.

36. A target structure according to clause 35 wherein said rectangular layout is a substantially square layout and said quarters are generally square.

37. A processing device arranged to receive at least first and second images of a target structure and to derive a measurement of one or more properties of one or more parts of a target structure by performing the steps (c) and (d) in the method of any of clauses 1 to 20.

38. A computer program product comprising machine readable instructions for causing a programmable processing device to receive at least first and second images of a target structure and to derive a measurement of one or more properties of one or more parts of the target structure by performing the steps (c) and (d) in the method of any of clauses 1 to 20.

39. A computer program product according to clause wherein said machine readable instructions are further arranged to cause the programmable processing device to control automatically the operation of an inspection apparatus to cause capture of the first and second images by steps (a) and (b) of the method.

40. A lithographic system comprising:
- a lithographic apparatus for applying a pattern onto one or more substrates;
- an inspection apparatus according to any of clauses 21 to 32; and
- a control system for controlling the lithographic apparatus using the measurement results from the inspection apparatus, when applying the pattern to further substrates.

41. A method of manufacturing devices wherein a device pattern is applied to a series of substrates using a lithographic process, the method including measuring one or more properties of at one or more structures formed as part of or beside said device pattern on at least one of said substrates using a method according to any of clauses 1 to 20, and controlling the lithographic process for later substrates in accordance with the result of the measuring.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A target structure comprising:
- at least three parts each periodic in both a first direction and a second direction, the first and second directions being non-parallel;
- at least two parts among the three parts having different bias values in the first direction;
- at least two parts among the three parts having different bias values in the second direction; and
- a fourth part comprising a grating structure formed in only one layer.

2. The target structure of claim 1, wherein each of the three parts is an overlay grating comprising grating structures formed in two or more layers.

3. The target structure of claim 1, wherein the target structure comprises a rectangular layout divided into similar quarters.

4. The target structure of claim 3, wherein the three parts are arranged in three quarters of the rectangular layout and the fourth part is arranged in a fourth quarter.

5. The target structure of claim 1, wherein the target structure consists of only the three parts.

6. The target structure of claim 5, wherein the different bias values in the first and second directions of the three parts comprise (+d, +d), (−d, +d), and (+d, −d), where d represents a relative offset distance between each of the respective three parts.

7. The target structure of claim 5, wherein the different bias values in the first and second directions of the three parts comprise (+d, +d), (−d, +d), and (0, −d), where d represents a relative offset distance between each of the respective three parts.

8. A target structure comprising:
- three parts each periodic in both a first direction and a second direction, the first and second directions being non-parallel;
- at least two parts among the three parts having different bias values in the first direction; and
- at least two parts among the three parts having different bias values in the second direction,
- wherein the different bias values in the first and second directions of the three parts comprise (+d, +d), (−d, +d), and (+d, −d), where d represents a relative offset distance between each of the respective three parts.

9. A target structure comprising:
- three parts each periodic in both a first direction and a second direction, the first and second directions being non-parallel;
- at least two parts among the three parts having different bias values in the first direction; and
- at least two parts among the three parts having different bias values in the second direction,
- wherein the different bias values in the first and second directions of the three parts comprise a zero relative offset distance between one of the respective three parts.

10. The target structure of claim 9, wherein the different bias values in the first and second directions of the three parts comprise (+d, +d), (−d, +d), and (0, −d), where d represents a relative offset distance between each of the respective three parts.

11. The target structure of claim 9, wherein the different bias values in the first and second directions of the three parts comprise (0, +d), (−d, +d), and (+d, −d), where d represents a relative offset distance between each of the respective three parts.

* * * * *